(12) United States Patent
Kato et al.

(10) Patent No.: US 9,333,749 B2
(45) Date of Patent: May 10, 2016

(54) METHOD FOR MANUFACTURING LIQUID EJECTION HEAD SUBSTRATE

(71) Applicant: CANON KABUSHIKI KAISHA, Tokyo (JP)

(72) Inventors: Masataka Kato, Hiratsuka (JP); Junichiro Iri, Yokohama (JP); Keisuke Kishimoto, Yokohama (JP); Taichi Yonemoto, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 608 days.

(21) Appl. No.: 13/669,100

(22) Filed: Nov. 5, 2012

(65) Prior Publication Data
US 2013/0139388 A1 Jun. 6, 2013

(30) Foreign Application Priority Data

Dec. 2, 2011 (JP) .................. 2011-264525
Mar. 8, 2012 (JP) .................. 2012-052111

(51) Int. Cl.
*B41J 2/16* (2006.01)
*H01L 21/768* (2006.01)
*H01J 3/02* (2006.01)

(52) U.S. Cl.
CPC .............. *B41J 2/1603* (2013.01); *B41J 2/1623* (2013.01); *B41J 2/1628* (2013.01); *B41J 2/1629* (2013.01); *B41J 2/1631* (2013.01); *B41J 2/1634* (2013.01); *B41J 2/1635* (2013.01); *H01J 3/022* (2013.01); *H01J 2329/00* (2013.01); *H01L 21/76802* (2013.01); *H01L 21/76825* (2013.01); *Y10T 29/42* (2015.01); *Y10T 29/49083* (2015.01); *Y10T 29/49401* (2015.01)

(58) Field of Classification Search
CPC ...... B41J 2/1603; B41J 2/1623; B41J 2/1628; B41J 2/1629; B41J 2/1631; B41J 2/1634; B41J 2/1635; H01L 21/76802; H01L 21/76825; H01L 21/31675; H01J 3/022; H01J 2329/00; Y10T 29/42; Y10T 29/49083; Y10T 29/49401
See application file for complete search history.

(56) References Cited

U.S. PATENT DOCUMENTS

| 5,909,033 A * | 6/1999 | Koga et al. .............. H01J 3/022 |
| 6,750,116 B1 * | 6/2004 | Chen ................. H01L 21/76802 |
| 7,211,526 B2 | 5/2007 | Iri et al. |
| 7,337,540 B2 * | 3/2008 | Kurosawa ......... Y10T 29/49401 |
| 2004/0192050 A1 * | 9/2004 | Yamashita ........ H01L 21/31675 |
| 2011/0041337 A1 | 2/2011 | Kato et al. |
| 2012/0088317 A1 | 4/2012 | Kishimoto et al. |

FOREIGN PATENT DOCUMENTS

JP 07266555 A * 10/1995
JP 2005-268752 A 9/2005

* cited by examiner

*Primary Examiner* — A. Dexter Tugbang
(74) *Attorney, Agent, or Firm* — Fitzpatrick, Cella, Harper & Scinto

(57) ABSTRACT

A method for manufacturing a liquid ejection head substrate, including: (1) a step for etching a substrate, which has an energy generating element at a side of a first surface, from a side of a second surface, which is a surface on the opposite side from the first surface, thereby to form at a time at least a part of a liquid supply port and a recess along a cutting section of the substrate; (2) a step for irradiating a laser beam toward the side of first surface from the etched surface of the recess so as to form a reformed portion inside the substrate; and (3) a step for cutting the substrate at the reformed portion.

10 Claims, 8 Drawing Sheets

METHOD FOR MANUFACTURING LIQUID EJECTION HEAD SUBSTRATE

BACKGROUND OF THE INVENTION

1. Field of the Invention

The present invention relates to a method for manufacturing a liquid ejection head substrate.

2. Description of the Related Art

A representative example of a liquid ejection head that ejects a liquid may be an ink-jet recording head applied to an ink-jet recording system adapted to perform recording by ejecting an ink onto a recording medium. According to a generally used method for manufacturing such an ink jet recording head, ejection elements, including ejection energy generating elements and ink ejection ports, for a plurality of ink-jet recording heads are fabricated at a time on a surface of a single silicon substrate, and then the substrate is cut into individual pieces of recording heads.

Japanese Patent Application Laid-Open No. 2005-268752 discloses a method for manufacturing an ink-jet recording head, in which a laser beam is focused into a silicon substrate to reform the interior thereof and then an external force is applied to cause cracks starting from the reformed portion to occur, thereby cutting the substrate.

SUMMARY OF THE INVENTION

The present invention is a method for manufacturing a substrate of a liquid ejection head, which has an energy generating element that generates energy for ejecting a liquid and a liquid supply port for supplying the liquid to the energy generating element, the method including: (1) a step for etching a substrate, which has the energy generating element on a first surface, from a second surface, which is a surface on the opposite side from the first surface, thereby to form at a time at least a part of the liquid supply port and a recess along a cutting section of the substrate, (2) a step for irradiating a laser beam toward the first surface from the etched surface of the recess so as to form a reformed portion inside the substrate, and (3) a step for cutting the substrate at the reformed portion.

Further features of the present invention will become apparent from the following description of exemplary embodiments with reference to the attached drawings.

DESCRIPTION OF THE EMBODIMENTS

Figure 1:
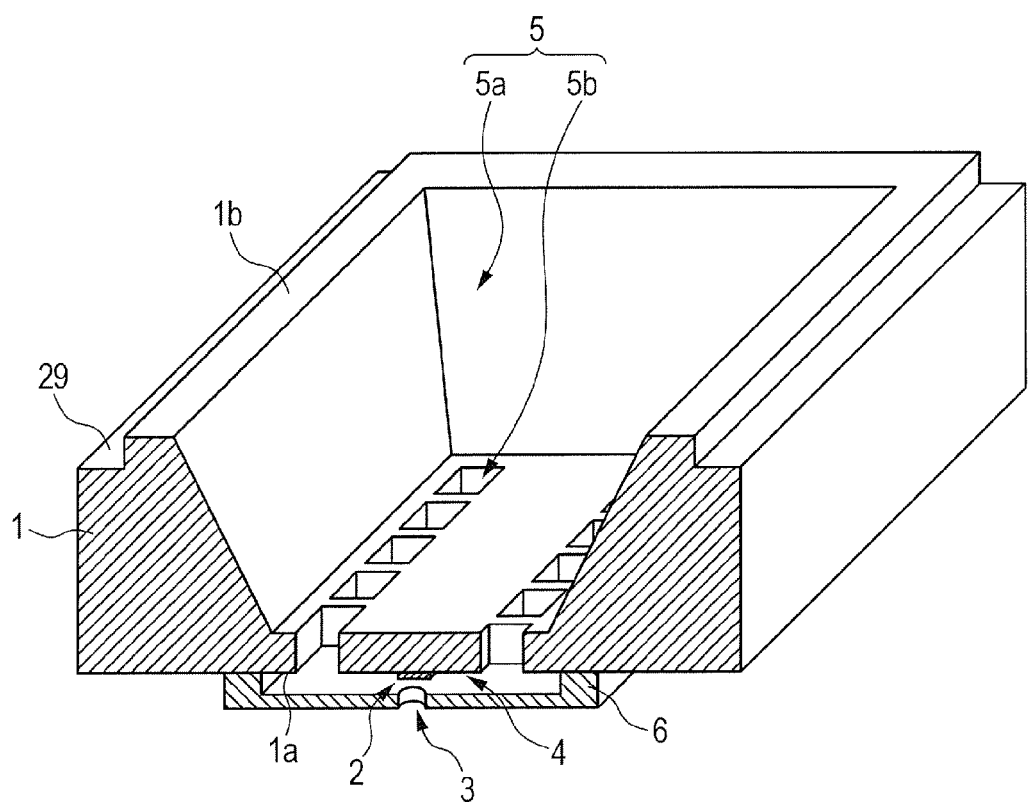
FIG. 1 is a schematic perspective view illustrating a configuration example of a liquid ejection head substrate manufactured by the present embodiment.

Preferred embodiments of the present invention will now be described in detail in accordance with the accompanying drawings.

The case where a laser beam is irradiated into a silicon substrate, as described in Japanese Patent Application Laid-Open No. 2005-268752, poses the following problem. Since the front surface of a silicon substrate has ejection elements provided in a high density, it is difficult to focus and converge a laser beam to a target position while avoiding the ejection elements. A possible solution to the problem is to irradiate the laser beam from the back surface. However, the back surface of the substrate has a greater surface roughness, as compared with the front surface, which is the surface for forming elements thereon, so that the laser beam diffusely reflects on the back surface. This inconveniently prevents the laser beam from being efficiently focused in the interior of the substrate, thus making it difficult to form a reformed region inside the substrate with high accuracy.

The flatness of the back surface of the silicon substrate may be improved by, for example, a grinding method called the back grinding process or etching with hydrofluoric nitric acid. This, however, would require an exclusive flattening step, possibly leading to an increased load on the manufacturing process.

An object of the present invention, therefore, is to provide a method for manufacturing a liquid ejection head substrate which enables obtaining, with a high yield, liquid ejection heads accurately cut out by efficiently focusing a laser beam into a substrate while restraining a load on a manufacturing process.

The following will describe the present invention with reference to the accompanying drawings. The same reference numerals will be assigned in the drawings for constituent elements having like functions, and descriptions thereof will be omitted in some cases.

Although the following description mainly refers to ink-jet head substrate as examples to which the present invention is applied, the application scope of the present invention is not limited thereto. The present invention can be applied also to, for example, the fabrication of biochips and the liquid ejection head substrates for printing electronic circuits. Liquid ejection head substrates may include, as well as ink-jet head substrates, for example, color filter manufacturing head substrates.

FIG. 1 is a schematic perspective view illustrating an example of an ink-jet head substrate manufactured according to the present embodiment. FIG. 1 is a schematic diagram illustrating the head substrate that has been partly cut at a plane orthogonal to the train of nozzles.

The ink-jet head substrate includes at least a substrate 1 having an energy generating elements 2 for generating energy, which is used for ejecting an ink, on a side of a first surface, which is a front surface. The substrate 1 also has an ink supply port 5 for supplying a liquid.

Referring to FIG. 1, the ink-jet head substrate has a substrate 1 which is formed of silicon and on which the energy generating elements 2 are arranged at a predetermined pitch. The energy generating elements 2 do not necessarily have to be in contact with the silicon substrate 1, and may alternatively be off the substrate 1. A first surface 1a of the substrate has ink ejection ports opened above the energy generating elements 2 (opened toward the bottom in FIG. 1), an ink flow path 4 in communication with an ink supply port 5 and ink ejection ports 3, and a flow path member 6 constituting the ink ejection ports 3 and the ink flow path 4. In FIG. 1, the flow path wall member constituting the inner wall of the ink flow path 4 and the ejection port member constituting the ejection ports are integrally formed as the flow path member 6.

The ink supply port 5 formed by etching the silicon substrate is provided such that it penetrates the first surface 1a, which is the front surface of the substrate 1, and a second surface 1b, which is the surface on the opposite side from the first surface.

In FIG. 1, the ink supply port 5 serving as a liquid supply port is composed of a first ink supply port 5a recessed to a predetermined depth from the second surface 1b and second ink supply ports 5b, each of which separately penetrates from the bottom surface of the first ink supply port to the first surface 1a. The first ink supply port is referred to also as a common ink supply port (common liquid supply port), while the second ink supply ports are referred to individual ink supply ports (individual liquid supply ports).

The ink-jet head substrate is provided with recesses 29 along cutting sections. A single wafer is divided into a plurality of pieces of substrates at the recesses 29. In the present invention, the recesses 29 are formed by etching. Etched surfaces formed by etching exhibit high flatness, and the bottom surface of an etched surface, in particular, tends to have an extremely high level of flatness. Each of the recesses 29 provides a region onto which a laser beam is focused. An etched surface, especially a bottom surface, has a high level of flatness, thus allowing the laser beam to be efficiently focused into the substrate. This enables to form a reformed region in the substrate with high positional accuracy. According to the present invention, the laser beam is directed toward the first surface from the side where the recess 29 is provided. When the laser beam is irradiated from the side opposite from the side where the recess 29 is provided in the substrate 1, i.e., the laser beam is irradiated from the first surface, such the effect described above can hardly be obtained.

In the ink-jet head substrate, ink is charged into the ink flow path 4 through the ink supply port 5. Then, the ink charged into the ink flow path 4 is ejected from the ink ejection ports 3 by a pressure generated by the energy generating element 2. The ejected ink droplets adhere to the recording medium to perform recording.

The following will describe embodiments of the method for manufacturing a liquid ejection head substrate in accordance with the present invention.

First Embodiment

A method for manufacturing an ink-jet head substrate according to the present embodiment will be described with reference to the sectional views of process steps in FIGS. 2A, 2B, 2C, 2D, 2E, 2F, 2G, 2H, 2I, 2J and 2K.

Figure 2A:
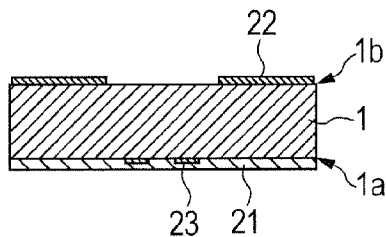
FIGS. 2A, 2B, 2C, 2D, 2E, 2F, 2G, 2H, 2I, 2J, and 2K are sectional views of individual process steps illustrating the method for manufacturing the liquid ejection head substrate according to an embodiment of the present invention.

First, as illustrated in FIG. 2A, a silicon substrate 1 provided with an ejection energy generating element (not shown) on a first surface 1a is prepared. An etching stop layer 23 and an adhesion improvement layer 21 are formed on the first surface, which is the front surface, of the silicon substrate 1.

A first etching mask layer 22 is formed on a second surface 1b, which is the back surface of the silicon substrate 1.

The adhesion improvement layer 21 can be formed by depositing, for example, a polyether amide, namely, HIMAL (trade name) manufactured by Hitachi Chemical Co., Ltd., on the first surface 1a of the silicon substrate 1 and then patterning the polyether amide by using a photolithography process.

The first etching mask layer 22 may be made of, for example, an oxide film, a nitride film or an organic film. Further, the first etching mask layer 22 preferably is made of a silicon dioxide film, a silicon nitride film, a silicon oxynitride film or the like, and more preferably made of a silicon dioxide film. The first etching mask layer 22 functions as the etching mask used when a first ink supply port 5a is formed in a later process step. Accordingly, the first etching mask layer 22 has an opening pattern in a region corresponding to the first ink supply port 5a.

The first etching mask layer 22 may be formed using other materials, such as a resin material which can function as a mask. The first etching mask layer 22 may be formed by placing a polyether amide, such as the HIMAL, on the back surface of the substrate and then patterning the polyether amide by using a photosensitive material as the mask.

The etching stop layer 23 functions as the etching stop layer of reactive ion etching (RIE) carried out to form second ink supply ports 5b in a later process step. The material used for the etching stop layer 23 is not particularly limited and may be made of, for example, Al. The etching stop layer may alternatively be made of, for example, a silicon oxide film or a silicon nitride film.

Figure 2F:
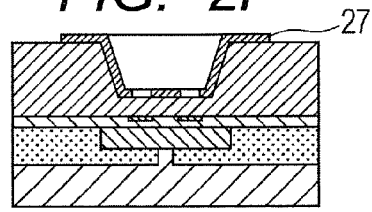
Figure 2B:
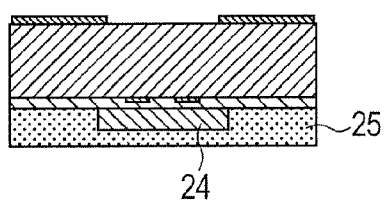

Then, as illustrated in FIG. 2B, a flow path mold member 24, which provides the molding member of an ink flow path, is deposited on the front surface of the silicon substrate 1. A material is applied to cover the formed flow path mold member 24, thereby forming the flow path member 25.

The flow path mold member 24 preferably is made of a material, such as a positive resist composed of a positive photosensitive resin, which can be dissolved by a solvent or a fluxing material.

The flow path member 25 may be made of, for example, a negative photosensitive resin.

Figure 2G:
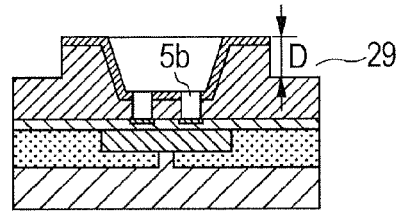
Figure 2C:
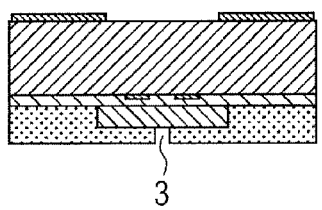

Subsequently, as illustrated in FIG. 2C, the ink ejection port 3 is formed in the flow path member 25 by using the photolithography process.

Figure 2H:
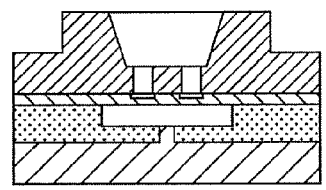
Figure 2D:
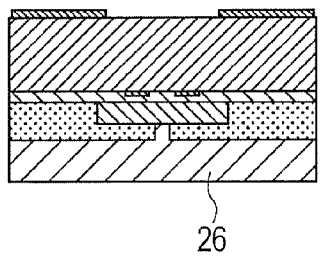

Subsequently, as illustrated in FIG. 2D, a protective film 26 for the protection from an etchant, such as an alkali solution, is formed on the flow path member 25.

Figure 2I:
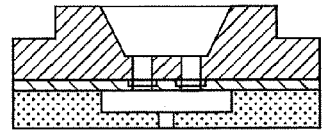
Figure 2E:
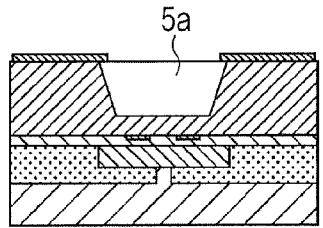

Subsequently, as illustrated in FIG. 2E, the silicon substrate 1 is etched toward the first surface from the second surface of the substrate so as to form the first ink supply port 5a. An example of the etching with an etchant is shown in FIG. 2E. The etching for forming the first ink supply port 5a is stopped before the first surface of the substrate is reached.

As the etchant, an alkali solution, such as tetramethyl ammonium hydride (TMAH), may be used. The immersion condition of the TMAH may be set such that, for example, the concentration of the TMAH is 22 mass % and the temperature is 83° C. The etching with the etchant is preferably anisotropic etching.

Subsequently, as illustrated in FIG. 2F, after removing the first etching mask layer 22, a second etching mask layer 27 is deposited in the first ink supply port 5a (in a common liquid supply port) and the back surface of the substrate.

The second etching mask layer 27 functions as the mask for forming a second ink supply port 5b and also functions as the mask for forming a recess 29 provided along a cutting section. Therefore, the second etching mask layer 27 has opening patterns in the region that matches the second ink supply port and the region that matches the recess 29 provided along the cutting section.

There is no particular restrictions on the method for depositing the second etching mask layer 27. Preferably, however, a spray application method whereby to spray an atomized resin, is used to apply a uniform coat on the uneven back surface of the substrate. As the spraying device, EVG150 (trade name) made by EVG, for example, may be used. The material used for the second etching mask layer does not have restrictions in particular. However, a novolac resin derivative or a naphthoquinone diazide derivative, for example, may be used because of high adhesiveness and high resistance to a dry etching gas used in a later process step. The second etching mask layer may be made of, for example, a photosensitive material (AZP4620 (trade name) made by AZ Electronic Materials), OFPR (made by TOKYO OHKA KOGYO CO., LTD.) or BCB (made by Dow Corning).

The exposure of the second etching mask layer 27 may be implemented by, for example, a projection type double-sided exposure apparatus (UX4031 made by USHIO ELECTRIC, INC.).

Further, according to the present embodiment, the focal position of exposure at the bottom of the first ink supply port 5a and the focal position of exposure of the second surface 1b differ in height by, for example, about 300 μm to about 650 μm. For this reason, adjusting to either one of the exposure focal positions fails to match the other exposure focal position, leading to patterning with a blurred imaging pattern. Patterning with the blurred imaging pattern causes a resist pattern to have a dull edge contour with a radius rather than having a vertical edge. Regarding this aspect, the blurry pattern can be improved to a certain extent by using a projection type exposure apparatus that has a long focal length. In the patterning of the recess 29 for focusing a laser beam, which is formed in the second surface 1b, a resist pattern having such an edge contour with a radius causes no problem. Thus, the focal position for the exposure is desirably adjusted to the bottom of the first ink supply port 5a.

Subsequently, as illustrated in FIG. 2G, the second ink supply ports 5b and the recesses 29 are formed at a time by the reactive ion etching (RIE).

The bottoms (etched surfaces) of the recesses 29 turn into flat surfaces by the reactive ion etching.

In the present process step, a depth D of each of the recesses 29, which are flattened regions, ranges, for example, from 100 μm to 400 μm, because the etching is carried out until the formation of the second ink supply port 5b is completed so as to penetrating the substrate. There are cases where, since the region to which the laser beam is irradiated is recessed, the laser beam is reflected and the intensity of the laser beam entering the substrate reduces at the time of irradiating the laser beam (a phenomenon known as vignetting). To avoid the vignetting, it is preferable to secure a flat surface matched to the NA of the laser beam. For this reason, specifically, if the depth D is 100 μm, then the width of the flat surface is preferably 340 μm or more, and if the depth D is 400 μm, then the width of the flat surface is preferably 760 μm or more.

The reactive ion etching (RIE) as recited in the present embodiment means directional etching using ions and it is a method whereby particles are collided against a region to be etched while providing electric charges. In the RIE etching is accomplished by using accelerated ions. An RIE apparatus is divided into a plasma source, which generates ions, and a reaction chamber, in which etching is carried out. For example, if an ICP (Inductive Coupling Plasma) dry etching apparatus that has an ion source capable of outputting high-density ions is used, then a liquid supply port perpendicular to a substrate is formed by alternately carrying out coating and etching, i.e., deposition and etching process. In the deposition and etching process, an $SF_6$ gas, for example, can be used as an etching gas, and a $C_4F_8$ gas, for example, can be used as a coating gas. In the present embodiment, it is preferable to use the dry etching by the ICP plasma apparatus; however, a dry-etching apparatus that has a different type of plasma source may also be used. For example, an apparatus having an electronic cyclotron resonance (ECR) ion source may be used.

The bottom surface, i.e., the surface to be etched, of the recess 29 in the present embodiment preferably has a surface roughness (Ra: arithmetic mean roughness) of 0.1 μm or less. For this reason, when alternately carrying out coating and etching, it is preferable to fist completely remove a coating film from the bottom and then move on to silicon etching. Preferably, sufficient time is allowed for removing the coating film. To be more specific, it is preferable to alternately repeat the silicon etching for 1 sec. to 10 sec., the formation of the coating film for 1 sec. to 10 sec., and the removal of the coating film for 1 sec. to 10 sec. Preferably, 3 sec. or more is allowed especially for the removal of the coating film. At that time, other etching conditions are preferably set such that the flow rate of $SF_6$ is 50 sccm to 1000 sccm, the flow rate of $C_4F_8$ is 50 sccm to 1000 sccm, and a gas pressure is 0.5 Pa to 50 Pa.

Subsequently, as illustrated in FIG. 2H, the etching stop layer 23 is removed.

There is no particular restriction on the method for removing the etching stop layer 23. For example, a publicly known method can be used. If the etching stop layer is formed of, for example, Al, then a mixed liquid of phosphoric acid, nitric acid and acetic acid can be used to remove the layer.

Subsequently, the adhesion improvement layer 21 is removed. There is no particular restriction on the method for removing the adhesion improvement layer, and a publicly known method can be used. The removal can be accomplished by, for example, chemical dry etching using a $CF_4$ gas and an $O_2$ gas.

Although not shown, patterning the adhesion improvement layer 21 beforehand allows the later removal step to be omitted.

Subsequently, as illustrated in FIG. 2I, the protective film 26 is removed. Further, the flow path mold member 24 is removed from the ink ejection port 3 and the second ink supply port 5b, thereby forming the ink flow path 4.

Thereafter, the flow path member 25 may be thermally cured.

Figure 2J:
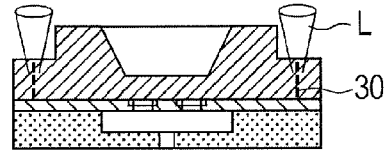

Subsequently, as illustrated in FIG. 2J, a laser beam L is focused to a predetermined depth inside the substrate below the recess 29 from the back surface, i.e., the second surface, of the substrate so as to form an internal processed region (also referred to as a reformed portion) at a position not reaching the front surface, i.e., the first surface, of the substrate. In other words, the reformed portion is formed inside the substrate by irradiating the laser beam to the first surface from the etched surface of the recess.

The reformed portion, i.e., the internal processed region, means a region in which the material of the substrate has developed a change in the crystal structure, softened, dissolved or cracked due to the focused laser beam. The reformed portion is formed in the substrate as described above and then the laser beam or the substrate is moved such that the light focus point is scanned (relatively moved) along an intended cleaving line, thereby forming a belt-like group of cracks along the intended cleaving line.

Figure 2K:
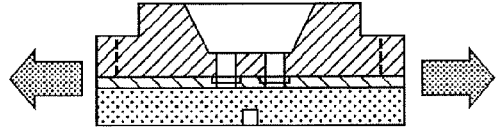

Then, as illustrated in FIG. 2K, after the internal processing by the laser beam, an external force is applied to cut and divide the substrate.

Applying the external force for cutting the substrate causes the stresses in the internal processed regions to be combined, giving rise to cracks in the substrate. Thus the substrate can be cut into small pieces.

The process for cutting (or dividing) the substrate into small pieces by focusing the laser beam is implemented by, for example, the following procedure.

Figure 6:
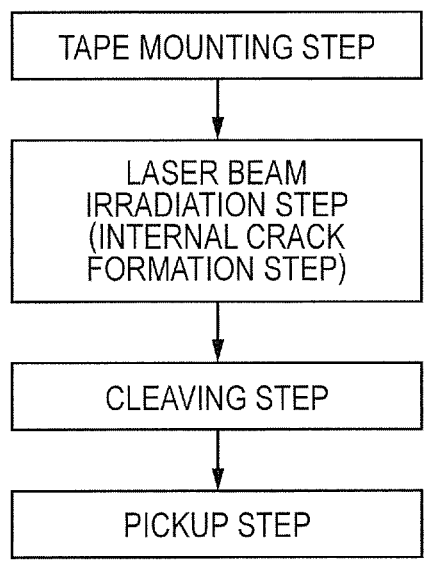
FIG. 6 is a flowchart illustrating a process for dividing a silicon substrate into element chips.

FIG. 6 is a flowchart illustrating an example of the cleaving process for dividing the substrate 1 into separate element chips. Referring to FIG. 6, the cleaving process is constituted of a tape mounting step, a laser beam irradiation step (internal crack formation step), a cleaving (cutting) step, and a pickup step.

The following will describe each of the steps in order.

(Tape Mounting Step)

In the tape mounting step, first, tape mounting for preventing elements from being separated during the process until the cleaving step is carried out. In the tape mounting step, an adhesive dicing tape to which a dicing frame has been attached is applied to the front surface of the substrate, that is, the surface on which constituents such as the ink ejection ports, have been formed. As the dicing tape, an adhesive tape to which an ultraviolet-cure type or pressure-sensitive type adhesive has been applied or an adhesive tape having a self-adhesion layer is used.

(Laser Beam Irradiation Step)

Figure 5:
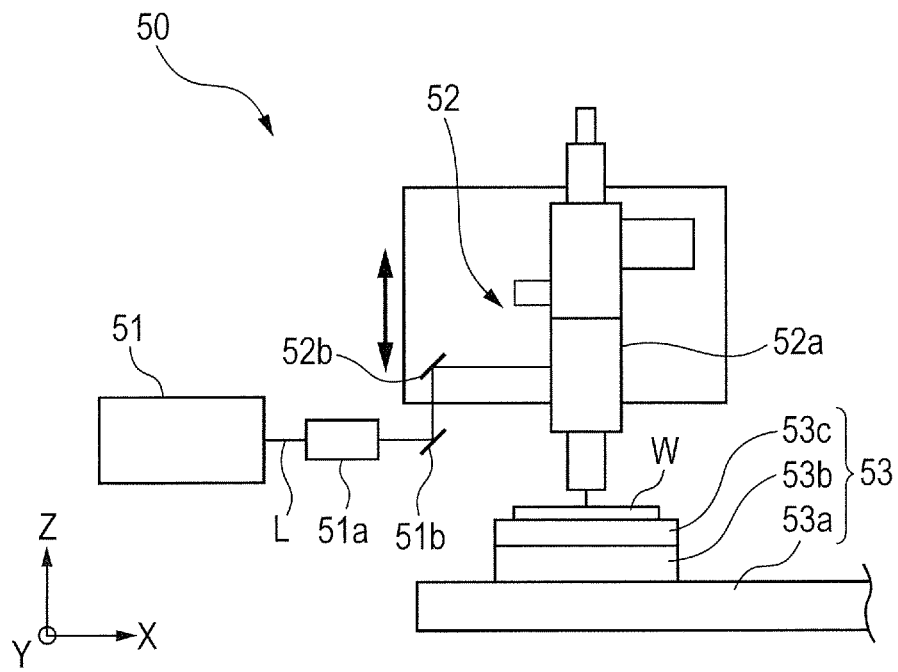
FIG. 5 is a schematic diagram illustrating a configuration example of a laser beam irradiation apparatus that can be used in the embodiment.

In the laser beam irradiation step, an internal processed region 30 as illustrated in FIG. 2J can be formed by using, for example, a processing apparatus 50 illustrated in FIG. 5. The processing apparatus 50 includes a light source optical system, a light collection optical system 52, an automatic stage 53, and an alignment optical system (not shown) adapted to perform alignment. The light source optical system has a light source 51, a beam expansion system 51a, a mirror 51b and the like. The light collection optical system 52 has a microscope objective lens 52a, a mirror 52b and the like. The automatic stage 53 has an X-stage 53a, a Y-stage 53b, a fine adjustment stage 53c and the like. For the light source 51, a fundamental wave (1064 nm) of, for example, a pulse YAG laser may be used. The pulse width is, for example, about 15 ns to about 1000 ns and the frequency is 10 to 100 kHz. The excitation source of the laser is a semiconductor laser, and the power of the excitation laser can be changed by the current injected to the semiconductor laser. The pulse width can be changed by changing the amount and the frequency of the injected current.

The laser beam L is selected on the basis of the spectral transmittance of the substrate 1. Hence, any light, which is in a wavelength band in which an intense electric field can be formed at a light focus point, and which exhibits silicon permeability, can be used. The laser beam L emitted from the light source 51 enters the light collection optical system 52 via the beam expansion system 51a and the like.

The microscope objective lens 52a of the light collection optical system 52 can be, for example, NA 0.42 when the magnifying power is 20 or NA 0.55 when the magnifying power is 50. Alternatively, considering the refractive index of silicon, a collecting lens which can be used for microscope observation and which is ideally suited for processing the interior of silicon may be used. The laser beam L focused on a work W by the light collection optical system 52 enters from the back surface 1b of the silicon substrate 1. The light flux incident from the back surface of the substrate is refracted in the silicon substrate 1 and collected at a light focus point A of a predetermined depth (a) in the substrate to form the internal processed region 30.

The depth of the light focus point A can be controlled by moving either the work W, which is the substrate 1, or the light collection optical system 52, in the direction of the optical axis thereby to shift the light focus position. If the refractive index of the substrate 1 relative to a wavelength of 1064 nm is denoted by n and the mechanical travel distance (the travel distance of the silicon substrate 1 or the light collection optical system 52 when moved in the direction of the optical axis) is denoted by d, then the optical travel distance of the light focus point A will be nd. The refractive index n of the substrate formed of silicon is in the vicinity of 3.5 at a wavelength of 1.1 to 1.5 μm. The comparison with a value of the refractive index actually measured by an experiment also indicates that n takes a value close to 3.5. This means that, if the mechanical travel distance is 100 μm, then the light focus point A of the laser beam L is formed at a position that is 350 μm from the front surface.

Thus, the internal processing right below the intended cleaving line can be accomplished by forming an internal crack from one point inside the substrate 1 and then relatively moving the light focus point along the intended cleaving line. Focusing the laser beam L onto the light focus point A causes the silicon crystal state to partly change, resulting in the occurrence of an internal crack. The length of the crack developed at one light focus point A ranges, for example, from 2 to 100 μm, while the thickness of the silicon substrate 1 involved is, for example, 725 μm. This means that a plurality of cycles of the internal processing is carried out to cleave the substrate.

(Cleaving Step)

Figure 7:
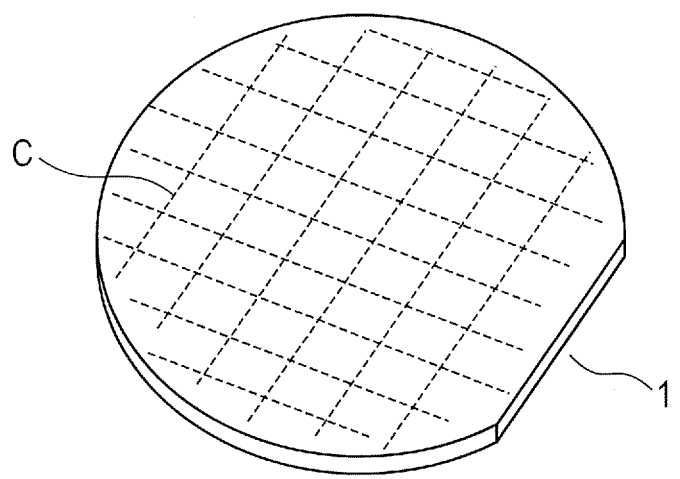
FIG. 7 is a schematic diagram illustrating intended cleaving lines for cutting the element chips out of a wafer substrate.

In the cleaving step, cleaving is carried out along each intended cleaving line C shown in FIG. 7. In a substrate having a plurality of internal cracks along the individual intended cleaving lines C, the individual logic elements of the silicon substrate after at least the laser processing have not been separated from the substrate. Hence, there is no danger of, for example, cut pieces, such as semiconductor element chips, falling off a cleaved member during transportation, and it is also possible to restrain the cut pieces from being dislocated. The dislocation of the cut pieces would adversely affect the action of an external force in the cleaving step.

The substrate in this state can be cleaved and separated into element chips according to, for example, the following procedure.

After forming the internal cracks, the substrate still mounted on the dicing tape is placed on an elastic rubber sheet of a cleaving apparatus such that the back surface of the substrate faces upward. The rubber sheet can be made of silicone rubber or fluoro-rubber. The cleaving is accomplished by applying compression to the silicon substrate through the intermediary of the dicing tape by a stainless roller. First, the substrate is placed on the rubber sheet such that one of the intended cleaving lines of the substrate, preferably a first cleaving direction, is substantially parallel to the axis of the roller. When the substrate is pressed while the roller is being rolled, the rubber sheet right below the roller goes down and deforms. A stress in a stretching direction is applied to the rubber sheet side, i.e., the front surface, of the substrate. As a result, the internal cracks are combined, causing the substrate to be cleaved along the intended cleaving lines. The cracks progress along the crystal orientation of the silicon substrate. Then, the silicon substrate is rotated by 90 degrees such that the intended cleaving lines in a second cleaving direction and the axis of the roller are substantially parallel to each other. As with the first cleaving direction, the silicon substrate is pressed by the roller, causing the internal cracks to be combined in the second cleaving direction so as to implement the cleaving.

(Pickup Step)

In the pickup step, the element chips separated by the cleaving step are carried out by carrying-out mechanisms, such as a suction collet and a pickup pin, and separately stored. At this time, by expanding the gaps among the elements by an expander or the like before picking them up, any slightly uncleaned portions, if any, can also be cleaved. In addition, the elements can be separately stored without causing the carrying-out mechanism to touch adjacent elements.

The following will describe other embodiments. Any constituents that are not referred to in each of the embodiments share the advantages obtained by other embodiments.

Second Embodiment

FIGS. 3A to 3D are sectional views of process steps illustrating a part of the process flow of the present embodiment.

Figure 3A:
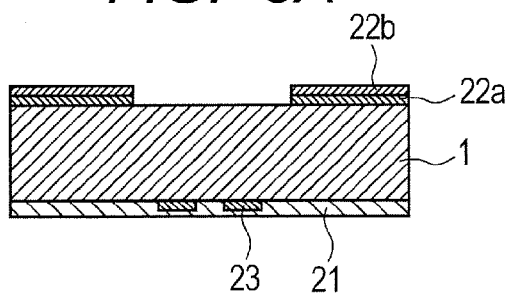
FIGS. 3A, 3B, 3C, and 3D are sectional views of individual process steps illustrating the method for manufacturing the liquid ejection head substrate according to another embodiment of the present invention.

The present embodiment differs from the first embodiment in that a first etching mask layer for forming a first ink supply port 5a is constituted of two layers, as illustrated in FIG. 3A. Referring to FIG. 3A, the first etching mask layer in the second embodiment is composed of a lower layer etching mask 22a and an upper layer etching mask 22b.

The lower layer etching mask 22a may be made of, for example, a silicon dioxide film, a silicon nitride film or an organic film. The lower layer etching mask 22a preferably is made of a silicon dioxide film, a silicon nitride film, a silicon oxynitride film or the like, more preferably made of the silicon dioxide film.

The upper layer etching mask 22b may be made of, for example, an organic film. Further, the upper layer etching mask 22b preferably is made of a material that imparts resistant property to the upper layer etching mask 22b as an anisotropic etching mask in the following process step. The organic film may be made of, for example, a polyether amide, namely, HIMAL (trade name) manufactured by Hitachi Chemical Co., Ltd.

Figure 3B:
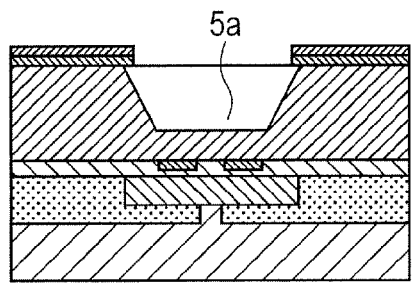

Subsequently, as illustrated in FIG. 3B, the first ink supply port 5a is formed by using the double-layer first etching mask layer as the mask.

Figure 3C:
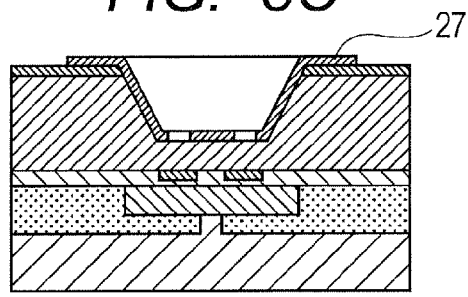

Subsequently, as illustrated in FIG. 3C, only the upper layer etching mask 22b is removed and then a second etching mask layer 27 is deposited.

The lower layer etching mask 22a is left on the back surface of the substrate. The second etching mask layer 27 is deposited also on the lower layer etching mask 22a on the back surface of the substrate.

Figure 3D:
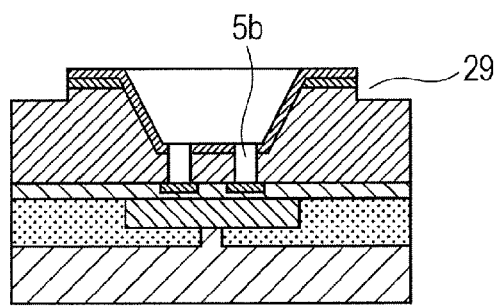

Then, as illustrated in FIG. 3D, reactive ion etching (RIE) is carried out toward the front surface from the back surface of the substrate thereby to form second ink supply ports 5b and recesses 29.

At this time, the lower layer etching mask 22a exists in a region where the recesses 29 are to be formed, so that the lower layer etching mask 22a is first etched to be removed and then the substrate thereunder is etched to be flattened. Hence, the recesses 29 in the present embodiment are formed to be shallower than those in the first embodiment, thus reducing the influences of the vignetting of a laser beam. This means that the internal processing by laser can be efficiently carried out even the flat surface is smaller.

Considering the rate (also referred to as selectivity) of etching the silicon substrate and the silicon dioxide film by the reactive ion etching and also considering the etching time for forming the second ink supply port 5b, the following conditions are desirable. If the selectivity ranges from 100 to 200 and the etching time ranges from 10 min. to 35 min., then the thickness of the silicon dioxide film is preferably 0.2 μm to 1 μm, and more preferably, 0.5 μm to 0.7 μm.

The steps thereafter are the same as the steps in the first embodiment illustrated in FIG. 2H and after.

Third Embodiment

In the second embodiment, it has been described that the recesses are formed to be shallower by leaving the lower layer etching mask 22a on the second surface.

According to the present embodiment, the second etching mask layer 27 is formed without removing the first etching mask layer after the first ink supply port 5a is formed in the first embodiment. This also makes it possible to form shallower recesses.

Fourth Embodiment

Figure 4A:
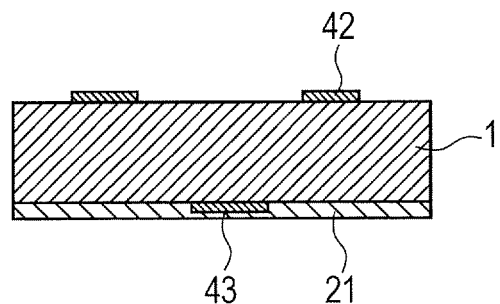
FIGS. 4A, 4B, and 4C are sectional views of individual process steps illustrating the method for manufacturing the liquid ejection head substrate according to still another embodiment of the present invention.
Figure 4B:
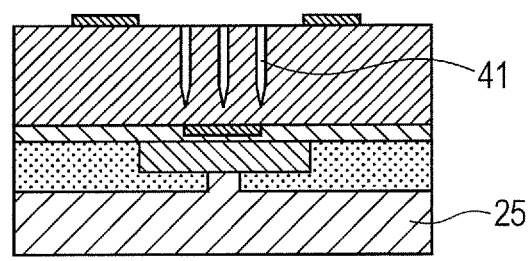
Figure 4C:
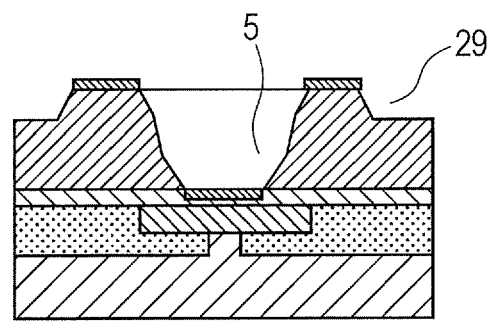

FIG. 4A to FIG. 4C are sectional views of process steps illustrating a part of the process flow of the present embodiment.

The present embodiment differs from the first embodiment in that leading holes 41, which are non-penetrated holes, are formed in the substrate to a desired depth from the second surface by laser processing, and then etching is carried out to form an ink supply port 5 and recesses 29 at the same time, as illustrated in FIG. 4B.

First, as illustrated in FIG. 4A, a silicon substrate 1 provided with an ejection energy generating element (not shown) is prepared. An etching stop layer 43 and an adhesion improvement layer 21 are deposited on the front surface of the silicon substrate 1. Etching mask layers 42 are deposited on the back surface of the silicon substrate 1.

The etching mask layers 42 are required to function as masks resistant to the later process step of crystal anisotropic etching, and may be made of silicon dioxide film or a resin material. The etching mask layers can be formed by, for example, applying and baking HIMAL, which is a polyether amide, onto the back surface of the substrate and then by patterning the baked HIMAL. Since the etching mask layers 42 will serve as the etching masks for forming the ink supply port 5 and the recesses 29 in a later process step, the etching mask layers 42 have opening patterns in the regions corresponding to the ink supply port 5 and the recesses 29.

Subsequently, as illustrated in FIG. 4B, the leading holes 41, which are non-penetrated holes, are formed by laser processing in the substrate 1 from the second surface.

Subsequently, as illustrated in FIG. 4C, etching is carried out from the second surface, using the etching mask layers 42 as the masks, thereby forming the ink supply port 5 and the recesses 29.

As the etching, the crystal anisotropic etching by TMAH solution or the like can be preferably used. Especially if the crystal anisotropic etching is used, the crystal orientations of the first surface and the second surface of the silicon substrate 1 are preferably <100>. Thus a <100> plane can be formed in a good shape on the bottom surface of the etched surfaces of the recess. Thus, stable formation of a reformed portion by laser beam irradiation will be ensured in a later process step.

As described in the second embodiment, the incidence of a laser beam involves the vignetting problem, so that the recesses in the irradiation regions are preferably formed to be shallow. For this purpose, the time of immersion in an etching solution is preferably set to be short. From this aspect, if the thickness of the silicon substrate is, for example, 725 μm±15

μm, then the leading holes are preferably formed to a depth of 600 μm to 690 μm. Further, the time of immersion in TMAH at this time is set to, for example, 40 min. to 280 min., and the depth of the recesses in the laser beam irradiation region is, for example, 20 to 140 μm.

The remaining process steps can be implemented by using the same techniques as those in the first embodiment illustrated in FIG. 2H and after.

Fifth Embodiment

Figure 8A:
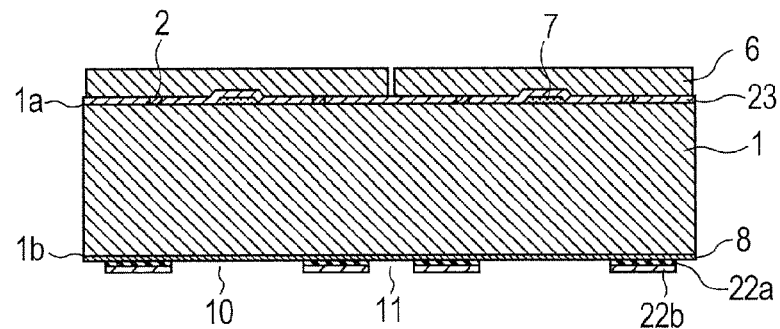
FIGS. 8A, 8B, 8C, 8D, and 8E are sectional views of individual process steps illustrating the method for manufacturing the liquid ejection head substrate according to yet another embodiment of the present invention.
Figure 8B:
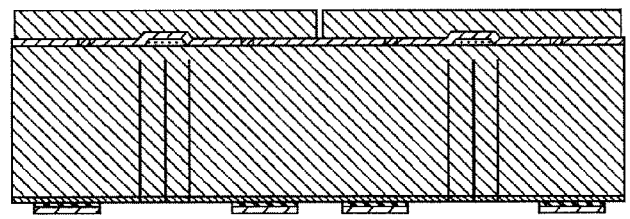
Figure 8C:
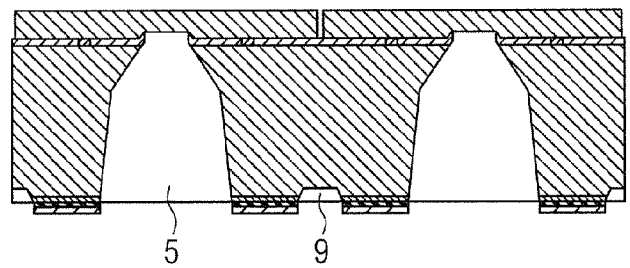
Figure 8D:
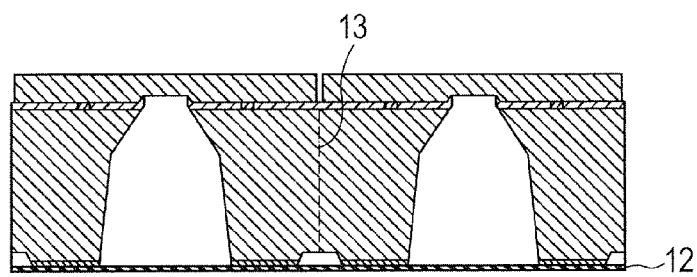
Figure 8E:
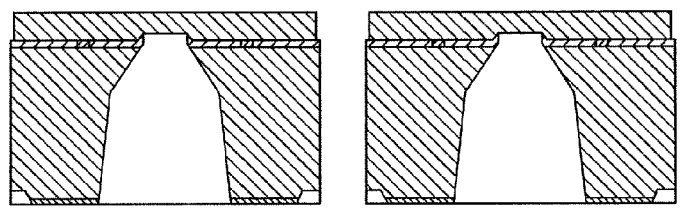
Figure 9:
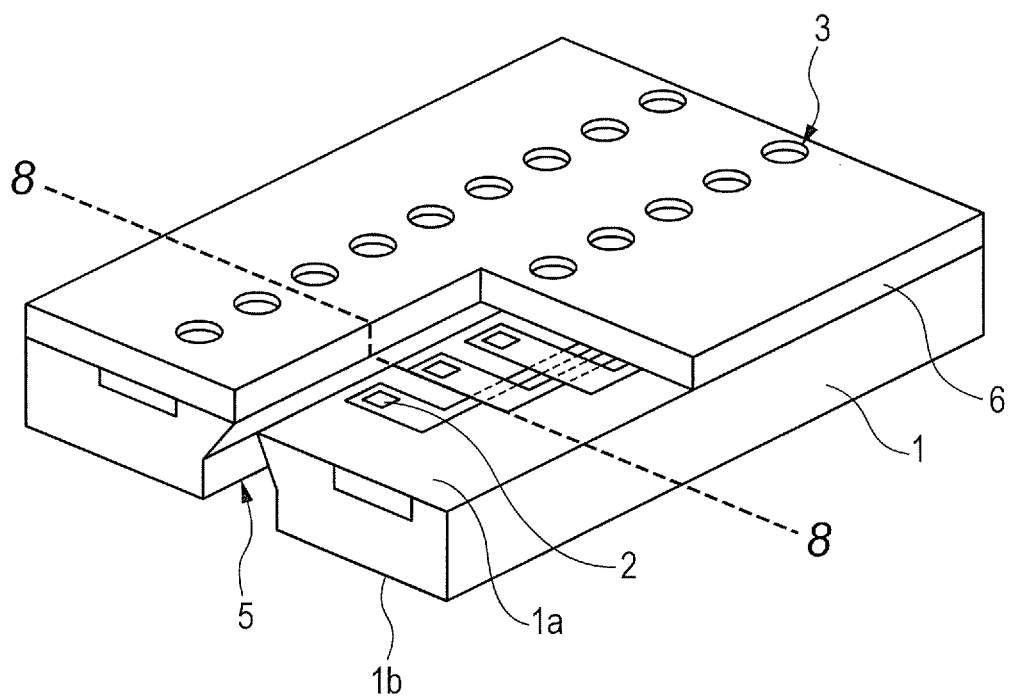
FIG. 9 is a schematic perspective view illustrating a configuration example of the liquid ejection head substrate manufactured by the embodiment.

FIG. 8 illustrates an example of the method for manufacturing a liquid ejection head substrate in accordance with the present invention, and illustrates the sectional views of the liquid ejection head substrate as shown in FIG. 9, taken at 8-8. FIG. 9 is a schematic perspective view illustrating an example of the ink-jet head substrate manufactured according to the present embodiment. As illustrated in FIG. 9, energy generating elements 2 that generate energy for ejecting liquids are disposed on a first surface 1a of a silicon substrate 1. The energy generating elements 2 do not necessarily have to be in contact with the silicon substrate 1 and may alternatively be disposed with a distance from the substrate. Control signal input electrodes for driving the energy generating elements 2 are electrically connected to the energy generating elements 2. Further, the first surface 1a of the substrate has ink ejection ports 3, formed in a flow path member 6, opened above the energy generating elements. The silicon substrate 1 has an ink supply port 5. The ink supply port 5 is formed by etching and it penetrates from a first surface 1a of the silicon substrate 1 to a second surface 1b, which is the surface opposite from the first surface. The crystal orientations of the first surface and the second surface of the silicon substrate are preferably <100>.

In the present embodiment, the description is given of the discrete silicon substrate 1 constituting a part of a liquid ejection head substrate. Practically, however, the same processing is carried out on each wafer. Further, an ejection port forming member or the like for constituting an ink flow path may be formed on the silicon substrate.

Referring to FIG. 8A, disposed on the first surface 1a of the silicon substrate 1 having the crystal orientation of <100> are the energy generating elements 2, which generate energy for ejecting liquids. The energy generating elements 2 are composed of, for example, TaN or TaSiN. Further, sacrificial layers 7 composed of aluminum are deposited on the first surface of the silicon substrate 1. The sacrificial layers 7 are effective when accurately defining the regions in which liquid supply ports are to be formed. An etching stop layer 23, which is etching-resistant to wet etching, is deposited on the first surface and the sacrificial layers 7 of the silicon substrate 1. The etching stop layer 23 is made of a material, such as SiO or SiN, which is resistant to an etchant used for the wet etching. The timing or order for depositing the sacrificial layers 7 and the etching stop layer 23 before the anisotropic etching can be arbitrarily determined as long as they are deposited on the first surface of the silicon substrate 1 before the wet etching is started. The thickness of the silicon substrate 1 preferably ranges from 200 μm to 1000 μm, whereas the thickness is 725 μm in the present embodiment.

A second surface 1b of the silicon substrate 1 preferably has a doped layer 8 containing a p-type impurity, which is preferably boron. When using boron, the boron can be injected such that the concentration of the impurity in a region at the depth of 10 μm from the second surface of the substrate 1 is $1 \times 10^{20}$ cm$^{-3}$ or more.

The second surface of the silicon substrate 1 is provided with a lower layer etching mask 22a and an upper layer etching mask 22b. The lower layer etching mask 22a is preferably composed of a silicon dioxide film, a silicon nitride film, a silicon oxynitride film or the like, and more preferably, the silicon dioxide film. The upper layer etching mask 22b is composed of, for example, an organic film, such as HIMAL manufactured by Hitachi Chemical Co., Ltd. The upper layer etching mask 22b is preferably made of a material that exhibits resistance required of an anisotropic etching mask in a later process step. The lower layer etching mask 22a and the upper layer etching mask 22b have openings. Among the openings, openings 10 corresponding to the sacrificial layers on the first surface are used for forming the liquid supply ports. Another opening 11 is used for forming a reformed layer, which will be discussed hereinafter. The width of the openings for forming the liquid supply ports preferably ranges from 200 μm to 1100 μm, although it depends on the shapes of the liquid supply ports. The width of the opening for dicing preferably ranges from 0.3 times to 1.0 times the thickness of the substrate and is preferably 500 μm or less. In the present embodiment, the width of the opening for dicing is set to 290 μm.

Subsequently, as illustrated in FIG. 8B, a laser beam is irradiated to the silicon substrate 1 through the openings 10 in the second surface of the silicon substrate 1 to form non-penetrated holes. The non-penetrated holes do not reach the first surface. For the laser beam, for example, a YAG laser triple wave (THG: 355-nm wavelength) can be used. The output and the frequency of the laser beam are set to appropriate values. The length, i.e., the depth, of the non-penetrated holes preferably ranges from 0.7 times to 0.95 times the thickness of the substrate. The length, i.e., the depth, of the non-penetrated holes has been set to 650 μm in the present embodiment. The diameter of the non-penetrated holes preferably ranges from ϕ5 μm to ϕ100 μm. The diameter of the non-penetrated holes in the present embodiment has been set to ϕ25 μm. When the diameter of the non-penetrated holes is smaller than ϕ5 μm, an etchant can hardly enter the non-penetrated holes during the wet etching, which is carried out in the subsequent step. If the diameter of the non-penetrated holes exceeds ϕ100 μm, then it would take relatively long to form the non-penetrated holes of a desired depth.

Alternatively, the formation of the non-penetrated holes may be omitted.

Subsequently, as illustrated in FIG. 8C, the wet etching is implemented from the second surface of the silicon substrate 1. At this time, the lower layer etching mask 22a and the upper layer etching mask 22b function as the etching masks. As the etchant, an alkali solution, such as tetramethyl ammonium hydride (TMAH) or potassium hydrate (KOH), may be used. The wet etching is preferably anisotropic etching. Etching the silicon substrate with the etchant allows the anisotropic etching to be accomplished. The ink supply ports 5 penetrating from the first surface to the second surface of the silicon substrate 1 are formed by the wet etching. The etching is stopped at the etching stop layer 23. In this step, at least a part of the ink supply ports 5 and a recess 9 along a cutting portion are formed at a time. The recess 9 along the cutting section is formed as the etching through the opening 11 for dicing progresses. The ink supply ports 5 and the recess 9 do not necessarily have to be completed at the same time. More specifically, even when the etching for both is started at the same time, the recess 9 may be completed first and then thereafter the ink supply ports 5 may be completed. When it is said that the at least a part of the ink supply ports 5 and the recess 9 along the cutting section are formed at a time, at certain timing the ink supply ports 5 and the recess 9 are both etched. Preferably, the etching for the ink supply ports 5 and the etching for the recess 9 are simultaneously started (the immersion in the etchant is started) and simultaneously ended (the immersion in the etchant is stopped).

After stopping the etching, the etching stop layer 23 is removed by dry etching or the like so as to cause the liquid supply ports to penetrate. The lower layer etching mask 22*a* and the upper layer etching mask 22*b* may be also removed by dry etching or the like.

Subsequently, as illustrated in FIG. 8D, a dicing tape 12 is applied to the second surface of the silicon substrate 1. For the dicing tape 12, an adhesive tape to which an ultraviolet-cure type or pressure-sensitive type adhesive has been applied or an adhesive tape having a self-adhesion layer is used. The laser beam is irradiated from the etched surface of the recess 9. The recess 9 along the cutting section is formed by the wet etching, thus exhibiting an extremely high level of flatness. Thus successful laser irradiation is permitted. Especially when the crystal orientations of the first surface and the second surface of the silicon substrate 1 are <100>, a surface having the <100> crystal orientation, which is an extremely flat surface, is conveniently exposed on the recess 9. In this case, the etched surface of the recess to which the laser beam is irradiated provides the surface having the <100> crystal orientation, thus permitting even better laser irradiation. The surface roughness (Ra: arithmetic mean roughness) of the surface of the recess 9 to which the laser beam is irradiated is preferably 0.1 μm or less. The laser beam has been irradiated from the second surface toward the first surface by multiphoton absorption laser processing, in which the laser focal point is set at each position of every 10% of the depth of the substrate. Thus, a reformed layer 13 composed of a reformed portion is formed. The reformed portion, i.e., the internal processed region, means a region in which the material of the substrate has developed a change in the crystal structure thereof, softened, dissolved or cracked due to the focused laser beam. The reformed portion is formed in the substrate as described above and then the laser beam or the substrate is moved such that the light focus point is scanned (relatively moved) along an intended cleaving line, thereby forming a belt-like group of cracks along the intended cleaving line. In the present embodiment, the feed speed of the laser processing has been set to 200 mm/sec. A laser beam having a fundamental wave (wave length of 1060 nm) of a YAG laser has been used, and the power and the frequency of the laser beam have been set to appropriate values; however, the laser beam is not limited thereto as long as a laser beam exhibits multiphoton absorption relative to a substrate material. For example, a femtosecond laser, which also exhibits the multiphoton absorption relative to silicon, can also be used.

Lastly, as illustrated in FIG. 8E, the substrate is cut by applying an external force to complete the liquid ejection head substrates. Applying the external force for the cutting to the substrate causes stresses to combine in the internal processed regions, leading to the occurrence of a crack. Thus the substrate can be divided into small pieces.

The present embodiment also obviates the need for providing a space for dicing, which is in this embodiment approximately 200 μm on a first surface, so that more liquid ejection head substrates can be manufactured from one wafer.

According to the present invention described above, the formation of at least a part of supply ports and the flattening of a portion of a back surface to which a laser beam is to be irradiated can be accomplished at a time by etching, thus allowing the back surface to be flattened with a reduced load on the manufacturing process. Thus a laser beam can be efficiently focused into a substrate so as to form reformed regions in the substrate with high positional accuracy. According to the present invention, therefore, liquid ejection heads can be accurately cut out with a high yield.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-264525, filed Dec. 2, 2011, and Japanese Patent Application No. 2012-052111, filed Mar. 8, 2012, which are hereby incorporated by reference herein in its their entirety.

What is claimed is:

1. A method for manufacturing a liquid ejection head substrate including an energy generating element that generates energy for ejecting a liquid and a liquid supply port for supplying the liquid to the energy generating element, the method comprising following steps in stated order:
   (1) a step for etching a substrate, which has the energy generating element at a side of a first surface, from a side of a second surface, which is a surface on an opposite side from the first surface, thereby to form at a time at least a part of the liquid supply port and a recess along a cutting section of the substrate;
   (2) a step for irradiating a laser beam toward the side of the first surface from an etched surface of the recess, the etched surface of the recess having been exposed by the etching, so as to form a reformed portion inside the substrate; and
   (3) a step for cutting the substrate at the reformed portion,
   wherein the liquid supply port comprises a common liquid supply port formed in the second surface and an individual liquid supply port formed in a bottom portion of the common liquid supply port, and the individual supply port and the recess are formed at a time in the step (1), and
   wherein the step (1) comprises following steps in stated order:
   (A) a step for preparing the substrate, which has the energy generating element at the side of the first surface and also has a first etching mask layer at the side of the second surface; and
   (B) a step for etching the substrate from the side of the second surface to form the common liquid supply port, and
   (C) a step for etching the substrate from the side of the second surface thereby to form at a time the individual liquid supply port and the recess; and
   wherein the first etching mask layer has an opening pattern in a region corresponding to the common liquid supply port.

2. The method according to claim 1, wherein the step (1) further comprises, between the step (B) and the step (C), following steps in stated order:
   (D) a step for removing the first etching mask layer; and
   (E) a step for depositing a second etching mask layer in the common liquid supply port and at the side of the second surface; and
   wherein the second etching mask layer has opening patterns in a region corresponding to the individual liquid supply port and a region corresponding to the recess.

3. The method according to claim 1, wherein the step (1) further comprises, between the step (B) and the step (C):

(F) a step for depositing a second etching mask layer in the common liquid supply port and on the first etching mask layer, wherein the second etching mask layer has opening patterns in a region corresponding to the individual liquid supply port and a region corresponding to the recess; and wherein the step (C) is a step for etching the substrate from the side of the second surface to remove at least a part of the first etching mask layer so as to form the individual liquid supply port and the recess.

4. The method according to claim 1, wherein, in the step (1), the first etching mask layer comprises a lower layer etching mask and an upper layer etching mask, wherein the step (1) further comprises, between the step (B) and the step (C):

(G) a step for removing the upper layer etching mask of the first etching mask layer; and (H) a step for depositing a second etching mask layer in the common liquid supply port and on the lower layer etching mask, wherein the second etching mask layer includes opening patterns in a region corresponding to the individual liquid supply port and a region corresponding to the recess, and wherein the step (C) is a step for etching the substrate from the side of the second surface to remove at least a part of the lower layer etching mask so as to form the individual liquid supply port and the recess.

5. The method according to claim 1, wherein the individual liquid supply port and the recess are formed by reactive ion etching.

6. The method according to claim 1, wherein the common liquid supply port is formed by crystalline anisotropic etching.

7. The method according to claim 1, wherein the liquid supply port is formed at a time with the recess, by forming a leading hole by laser processing in a region of the second surface in which the liquid supply port is to be formed and then by etching the substrate.

8. The method according to claim 7, wherein
the leading hole is formed in the step (B).

9. The method according to claim 7, wherein the liquid supply port and the recess are formed by crystalline anisotropic etching.

10. The method according to claim 1, wherein a surface roughness (Ra: arithmetic mean roughness) of the etched surface of the recess is 0.1 µm or less.

* * * * *